United States Patent
Tomishima et al.

(10) Patent No.: US 9,437,298 B1
(45) Date of Patent: Sep. 6, 2016

(54) SELF-STORING AND SELF-RESTORING NON-VOLATILE STATIC RANDOM ACCESS MEMORY

(71) Applicant: Intel Corporation, Santa Clara, CA (US)

(72) Inventors: Shigeki Tomishima, Portland, OR (US); Dmitri E. Nikonov, Beaverton, OR (US); Elijah V. Ilya Karpov, Santa Clara, CA (US); Ian A. Young, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/668,896

(22) Filed: Mar. 25, 2015

(51) Int. Cl.
| | |
|---|---|
| *G11C 11/00* | (2006.01) |
| *G11C 14/00* | (2006.01) |
| *G11C 13/00* | (2006.01) |
| *G11C 11/412* | (2006.01) |
| *G11C 11/419* | (2006.01) |
| *G11C 11/416* | (2006.01) |
| *G11C 11/413* | (2006.01) |
| *G11C 11/411* | (2006.01) |

(52) U.S. Cl.
CPC .......... *G11C 14/009* (2013.01); *G11C 11/412* (2013.01); *G11C 11/413* (2013.01); *G11C 11/416* (2013.01); *G11C 11/419* (2013.01); *G11C 13/0097* (2013.01); *G11C 11/4116* (2013.01)

(58) Field of Classification Search
CPC . G11C 11/412; G11C 11/413; G11C 11/416; G11C 11/419; G11C 11/4116

USPC .......................................... 365/154, 155, 156
See application file for complete search history.

(56) References Cited

U.S. PATENT DOCUMENTS

| | | | | |
|---|---|---|---|---|
| 6,111,780 | A * | 8/2000 | Bertin | G11C 11/4125 257/E27.099 |
| 6,556,487 | B1 * | 4/2003 | Ratnakumar | G11C 14/00 365/154 |
| 6,847,543 | B2 * | 1/2005 | Toyoda | G11C 13/0004 365/100 |
| 7,483,290 | B2 * | 1/2009 | Kikuchi | G11C 14/00 365/154 |
| 8,243,498 | B2 * | 8/2012 | Abe | G11C 11/15 365/148 |
| 2004/0001373 | A1 | 1/2004 | Liaw et al. | |

(Continued)

OTHER PUBLICATIONS

International Search Report and Written Opinion for International Application No. PCT/US16/18058 mailed Jun. 3, 2016, 11 pages.

*Primary Examiner* — Pho M Luu
(74) *Attorney, Agent, or Firm* — Green, Howard & Mughal LLP

(57) ABSTRACT

An apparatus is provided which comprises: a Static Random Access Memory (SRAM) cell with at least two non-volatile (NV) resistive memory elements integrated within the SRAM cell; and first logic to self-store data stored in the SRAM cell to the at least two NV resistive memory elements. A method is provided which comprises performing a self-storing operation, when a voltage applied to a SRAM cell decreases to a threshold voltage, to store voltage states of the SRAM cell to at least two NV resistive memory elements, wherein the at least two NV resistive memory elements are integrated with the SRAM cell; and performing self-restoring operation, when the voltage applied to the SRAM cell increases to the threshold voltage, by copying data from the at least two NV resistive memory elements to storage nodes of the SRAM cell.

23 Claims, 10 Drawing Sheets

(56) References Cited

U.S. PATENT DOCUMENTS

2004/0080972 A1   4/2004  Seshadri et al.
2009/0109734 A1   4/2009  Hanafi
2011/0085372 A1   4/2011  Fackenthal
2011/0273925 A1   11/2011 Yamamoto et al.

* cited by examiner

US 9,437,298 B1

SELF-STORING AND SELF-RESTORING NON-VOLATILE STATIC RANDOM ACCESS MEMORY

BACKGROUND

Static Random Access Memories (SRAMs) are volatile memories. As such, when power to the SRAMs is cut off, the SRAMs lose data stored in their storage nodes. One way to save the data from being lost is to read the entire SRAM and copy its data in a separate mirror array formed of a non-volatile (NV) memory. This data is saved in the NV memory during power down of the SRAM, and then written back to the SRAM during power-up of the SRAM.

Having a separate NV memory to mirror the SRAM takes up area. The separate NV memory also increases power consumption because the volatile memory (i.e., SRAM) has to be read from and then re-written during power-down and power-up events. A memory architecture that uses a separate NV memory array may also require executing a microcode and sending the data through a bus between the SRAM die and the NV memory array.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
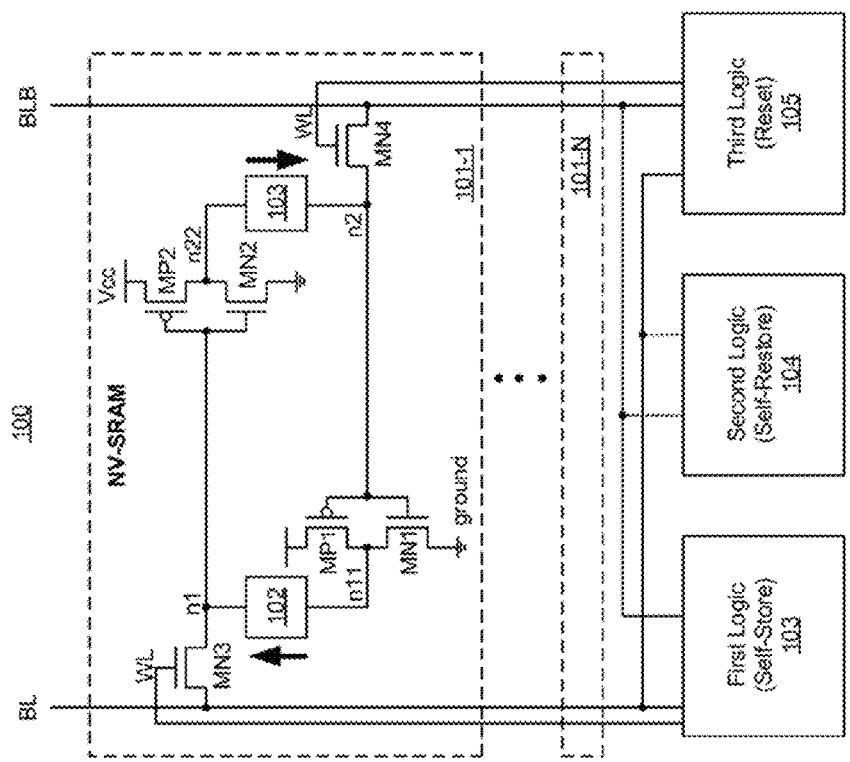
FIG. 1 illustrates part of a memory architecture with Static Random Access Memory (SRAM) bit-cell including integrated non-volatile (NV) mirror cell and associated logic, according to some embodiments of the disclosure.

In some embodiments, a Static Random Access Memory (SRAM) is provided which comprises an integrated non-volatile (NV) memory (also referred to as a mirror cell) such that each SRAM bit-cell has associated two integrated NV mirror memory elements. In some embodiments, when a processor enters a low power-state (e.g., sleep state) or during a power failure event, data from the traditional SRAM storage cell nodes is dynamically stored (or mirrored) in the integrated NV memory elements. As such, the data is saved from being lost. In some embodiments, when the processor having the NV-SRAM enters an active state or when the power is fully on (or partially on), then data is re-stored dynamically from the integrated NV memory back to the SRAM storage nodes.

In some embodiments, NV memory comprises resistive NV memory element that stores information using a memory element with a variable resistance. For example, the resistance of spin transfer torque (STT)—magnetic random access memory (MRAM) depends on the relative magnetization polarities of two magnetic layers. Other types of resistive memory include resistive RAM (ReRAM) and conductive bridging RAM (CBRAM), whose resistances depend on the formation and elimination of conduction paths through a dielectric or an electrolyte. There is also phase change memory (PCM), for which the resistivity of a cell depends on the crystalline or amorphous state of a chalcogenide. Although the underlying memory element for these (and possibly other) resistive memory technologies may vary, methods for writing to and reading from them can be electrically similar and are encompassed by various embodiments of the present disclosure.

Some embodiments describe a memory bit-cell and associated logic that allow for self-storing of the memory state into the integrated NV memory when the voltage level of the power supply to the NV-SRAM falls below a predetermined threshold or when the NV-SRAM enters a low power state (e.g., sleep state). Examples of low power states are described with reference to power states in the Advanced Configuration and Power Interface (ACPI) specification Revision 5.0a published Nov. 13, 2013. In some embodiments, a sensor senses the voltage level of the power supply to determine whether it is above or below the predetermined threshold (e.g., $\frac{2}{3}$ Vcc or another fraction of Vcc). Here, the term "threshold" generally refers to a voltage level below which data in the storage nodes of the SRAM cell may lose their values. In some embodiments, the power state is determined by a register state in a power management module of a processor coupled to the memory. In some embodiments, a memory bit-cell architecture is provided which self-restores the state in the traditional SRAM nodes when the power to the NV-SRAM is restored or partially restored.

There are many technical effects of various embodiments. For example, the integrated NV mirror cells do not affect the SRAM cell performance. The additional overhead of the integrated NV mirror cells is much less than having a dedicated mirror array. As such, the integrated NV mirror cells achieve higher array layout efficiency compared to external NV devices and chips by minimizing add-on circuits. For example, the NV mirror cells are coupled to the nodes of a SRAM cell which are not conducting in normal operation. The overall area of various embodiments is smaller than memories having dedicated mirror arrays which may include mirror devices and mirror chips far outside of the SRAM array.

The total power consumption of various embodiments is smaller than the power consumption of SRAM arrays with external NV devices and chips. One reason for lower power consumption is that the NV memory cells are integrated within the silicon process technology and any inter-chip data transfer is significantly reduced (in some cases to zero). Various embodiments perform automatic self-restore, for example, by restoring data stored in the NV device to the SRAM cell at power-up. Other technical effects will be evident from various embodiment described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates part of a memory architecture 100 with an SRAM bit-cell including an integrated NV mirror cell and associated logic, according to some embodiments of the disclosure. In some embodiments, part of architecture 100 comprises SRAM bit-cells (e.g., a column of NV-SRAMs 101-1 through 101-N, where 'N' is an integer), First Logic 103 (for self-storing), Second Logic 104 (for self-restoring), and Third Logic 105 (for resetting). In some embodiments, these logic units are part of the memory peripheral circuits, and so are coupled to the memory bit-cells. While the embodiment of FIG. 1 is illustrated as having three logic units, these logic units may be combined into fewer logic units. For example, a single logic unit may be provided that can manage the operations of self-storing, self-restoring, and resetting the NV SRAMs.

In some embodiments, NV-SRAM bit-cell 101-1 comprises six transistors (6T) and at least two NV resistive memory elements 102 and 103 (i.e., mirror cells). While the embodiment of the bit-cell is illustrated having six transistors, other architectures for bit-cells may also be used. For example, 4T or 8T bit-cells configured with integrated NV resistive memory elements 102/103 may be used instead of the 6T SRAM bit-cell as the underlying SRAM bit-cell.

In some embodiments, NV-SRAM bit-cell 101-1 comprises n-type transistors MN1, MN2, MN3, and MN4; and p-type transistors MP1 and MP2. Transistors MN3 and MN4 are access devices controllable by word-line (WL). In some embodiments, access devices are p-type devices which are controllable by complementary WL signals. The source/drain terminals of the access devices MN3 and MN4 are coupled to bit-line (BL) and complementary bit-line (BLB) as shown. Here, labels for nodes and signals are interchangeably used. For example, BL may refer to the node BL or signal BL depending on the context of the sentence.

Transistors MP1 and MN1 together form a first inverter, while transistors MP2 and MN2 together form a second inverter. In some embodiments, a first NV resistive memory device 102 is coupled between nodes n1 and n11 such that first NV resistive memory device 102 couples the output node n11 of the first inverter to the access device MN3 and to the second inverter through node n1. In some embodiments, a second NV resistive memory device 103 is coupled between nodes n2 and n22 such that second NV resistive memory device 103 couples the output node n22 of the second inverter to the access device MN4 and to the first inverter though node n2.

In some embodiments, first and second resistive memory elements 102 and 103 store information using a memory element with a variable resistance. For example, the resistance of STT based device depends on the relative magnetization polarities of two magnetic layers (i.e., free magnetic layer and fixed/pinned magnetic layer). In some embodiments, first and second resistive memory elements 102 and 103 are magnetic tunneling junction (MTJ) devices. In one such embodiment, the free magnetic layer of MTJ device 102 is coupled to node n1 while the fixed magnetic layer of MTJ device 102 is coupled to node n11. Continuing with the MTJ example, in some embodiments, the free magnetic layer of MTJ device 103 is coupled to node n2 and the fixed magnetic layer of MTJ device 103 is coupled to node n22.

In some embodiments, first and second resistive memory elements 102 and 103 are formed from conductive bridging devices as used in CBRAM. The resistance of the conductive bridging devices depend on the formation and elimination of conduction paths through a dielectric or an electrolyte. In some embodiments, first and second resistive memory elements 102 and 103 are formed with PCM devices. The resistance of a PCM device depends on the crystalline or amorphous state of a chalcogenide. In some embodiments, first and second resistive memory elements 102 and 103 are formed using Metal-Insulator-Metal (MIM) based structures. Although the underlying memory element for these (and possibly other) resistive memory technologies may vary, methods for writing to and reading from them can be electrically similar and are encompassed by various embodiments of the present disclosure.

Writing a binary '0 or '1 (i.e., a logic low or a logic high, respectively) into the NV resistive memory elements 102/103 involves driving an applied current through, or voltage across, the resistive element in the NV-SRAM bit-cell to force it into a higher-resistivity ($R_H$) or a lower-resistivity ($R_L$) state (e.g., by means of spin transfer torque with STT-MRAM, heating with PCM, metal migration with ReRAM, or metal ion flow with CBRAM). A Typical value for $R_H$ is 20 kilo Ohms (kΩs) while a typical values for $R_L$ is 10 kΩs (which generally exceeds the on-state resistance of the transistors). Depending on the technology of the resistive memory elements 102/103, application of 0.5V to 1.0V with a duration of 100 ps (picoseconds) to 1 ns (nanoseconds) may be used to switch the resistances from $R_H$ to $R_L$ or from $R_L$ to $R_H$, for example. Positive or negative polarity of a voltage bias determines whether the switching is from $R_L$ to $R_H$ or vice versa. In some embodiments, NV resistive elements 102/103 are directional (i.e., not symmetric relative to the change of sign of voltage across them) as indicated by the bold arrows next to the NV resistive elements 102/103.

In some embodiments, NV-SRAM 101-1 is operable to self-store and self-restore its contents. As such, during power down or power loss, NV-SRAM 101-1 can save data stored on the storage nodes n1 and n2 on to first and second resistive memory elements 102 and 103, respectively. In some embodiments, as power becomes available to NV-SRAM 101-1, data stored in first and second resistive memory elements 102 and 103 is restored back to the storage nodes n1 and n2. In some embodiments, the self-store and self-restore operations are performed without sending/receiving data on the memory interface.

For purposes of explaining the self-store and self-restore operations, node n1 is initially assumed to be charged to Vcc while node n2 is initially assumed to be at zero volts. In some embodiments, First Logic 104 detects voltage level of Vcc to determine whether the power supply to the NV-SRAM is below Vmin (i.e., the minimum operating supply level below which the storage nodes n1 and n2 lose their stored data). In some embodiments, when First Logic 104 determines that the voltage level of Vcc is getting close to becoming below Vmin level (e.g., within 5% of Vmin), then it begins the process of self-store to save data from storage nodes n1 and n2 to resistive memory elements 102/103, respectively.

In some embodiments, First Logic 104 begins the process of self-store as soon as it receives an indication that the process is about to lose power (e.g., the processor having the memory is being shut-down or is entering a low power state such as sleep state). In other embodiments, other indications may be used by First Logic 104 to determine when to begin the self-store process.

In some embodiments, First Logic 104 begins the self-store process by setting both bit-lines (i.e., BL and BLB) substantially to zero volts (or to ground). In some embodiments, voltage to the WLs (which are coupled to the gate terminals of transistors MN3 and MN4) is set by First Logic 104 to be above Vtn (i.e., threshold voltage of n-type transistors MN3/MN4) and below power supply Vcc. For example, WLs are set to 0.4 Vcc which is enough to open (i.e., turn on) the gates of the access transistors MN3 and MN4.

By applying a voltage just above the threshold voltage, the resistances of the access devices MN3 and MN4 becomes higher than the resistances of first and second resistive elements 102 and 103, respectively. As such, voltage drop appears on node n1 (which was initially charged at Vcc level). For example, voltage on node n1 drops from Vcc level to 0.5V. Continuing with the same example, no voltage drop occurs on node n2 because it was previously at zero volts. The voltage on node n22 remains at zero volts, while the voltage on node n11 is substantially Vcc (i.e., slightly less than Vcc due to resistance change of first resistive device 102).

In this example, resistance of second NV resistive device 103 remains high resistance ($R_H$) while the resistance of first NV resistive device 102 reduces from high resistance $R_H$ to low resistance ($R_L$) because the voltage on node n1 drops from its previous Vcc level. As such, previously stored data on nodes n1 and n2 are imprinted on first and second NV resistive elements 102 and 103 as indicated by the resistances $R_L$ and $R_H$, respectively, without data being transferred from outside of the NV-SRAM cells. Here $R_L$ state is the resistance of first NV resistive device 102 which indicates storage of logic high while $R_H$ is the resistance of second NV resistive device 103 which indicates storage of logic low.

In some embodiments, Second Logic 104 is operable to cause NV-SRAM 101-1 to self-restore its values. For example, Second Logic 104 may enable NV-SRAM 101-1 to begin restoring the voltages on the storage nodes n1 and n2. In some embodiments, self-restoring operation occurs independent of Second Logic 104 (i.e., automatically as Vcc power supply rises to its normal level).

When the power supply is out (e.g., during low power state or when the computing system having the SRAM is powered off), voltages on BL, BLB, WL, and the internal nodes (e.g., n1, n2, n22, and n11) are discharged overtime to zero volts. As power supply rises (i.e., Vcc rises to its normal level), the first inverter becomes operational and inverts the input on node n2 (at zero volts) as high voltage on node n11. Because of the low resistance $R_L$ of first NV resistive device 102, the voltage on node n1 rises from zero volts to Vcc. However, because of the high resistance $R_H$ of second NV resistive device 103, node n2 remains at zero volts as reinforced by the second inverter (i.e., transistors MP2 and MN2). As such, original data on storage nodes n1 and n2 (i.e., logic high and logic low) are restored automatically as power supply rises to Vcc level, according to some embodiments.

In some embodiments, after the self-restore operation is complete (e.g., after waiting for a predetermined amount of time), first and second NV resistive elements 102 and 103 are reset. By resetting first and second NV resistive elements 102/103, issues related with historical data stored on first and second NV resistive elements 102/103 interfering with correctly storing of new data is avoided. In some embodiments, Third Logic 105 is operable to reset first and second NV resistive elements 102 and 103 during idle time. For example, when no data is being recorded in the SRAM, or when the SRAM is inactive, Third Logic 105 initiates the reset operation. In some embodiments, to reset first and second NV resistive elements 102 and 103, both bit-lines (i.e., BL and BLB) and WL are set to power supply level (i.e., Vcc). As such, the access devices MN3 and MN4 are turned on.

When the access device MN3 turns on, voltage on node n1 becomes logic high (i.e., Vcc level). Continuing with this example, the second inverter causes node n22 to become logic low (or remains at logic low). Due to the previous high resistance state of second NV resistive device 103, voltage on node n2 remains the same (i.e., zero volts). As such, when the access devices MN3 and MN4 turn on, high resistance state $R_H$ is set on first and second NV resistive elements 102 and 103, respectively (i.e., first and second NV resistive elements are reset to known resistance states). By resetting the resistances of first and second NV resistive elements 102 and 103 to $R_H$, NV-SRAM bit-cell 101-1 can perform normal operation because first and second NV resistive elements 102 and 103 do not interfere with normal read/write memory operations.

In some embodiments, NV resistive memory elements 102/103 are integrated with SRAM cell core (e.g., the traditional 6T or 8T transistors) such that states of NV resistive memory elements 102/103 are preserved during normal operations of the SRAM cell.

Figure 2:
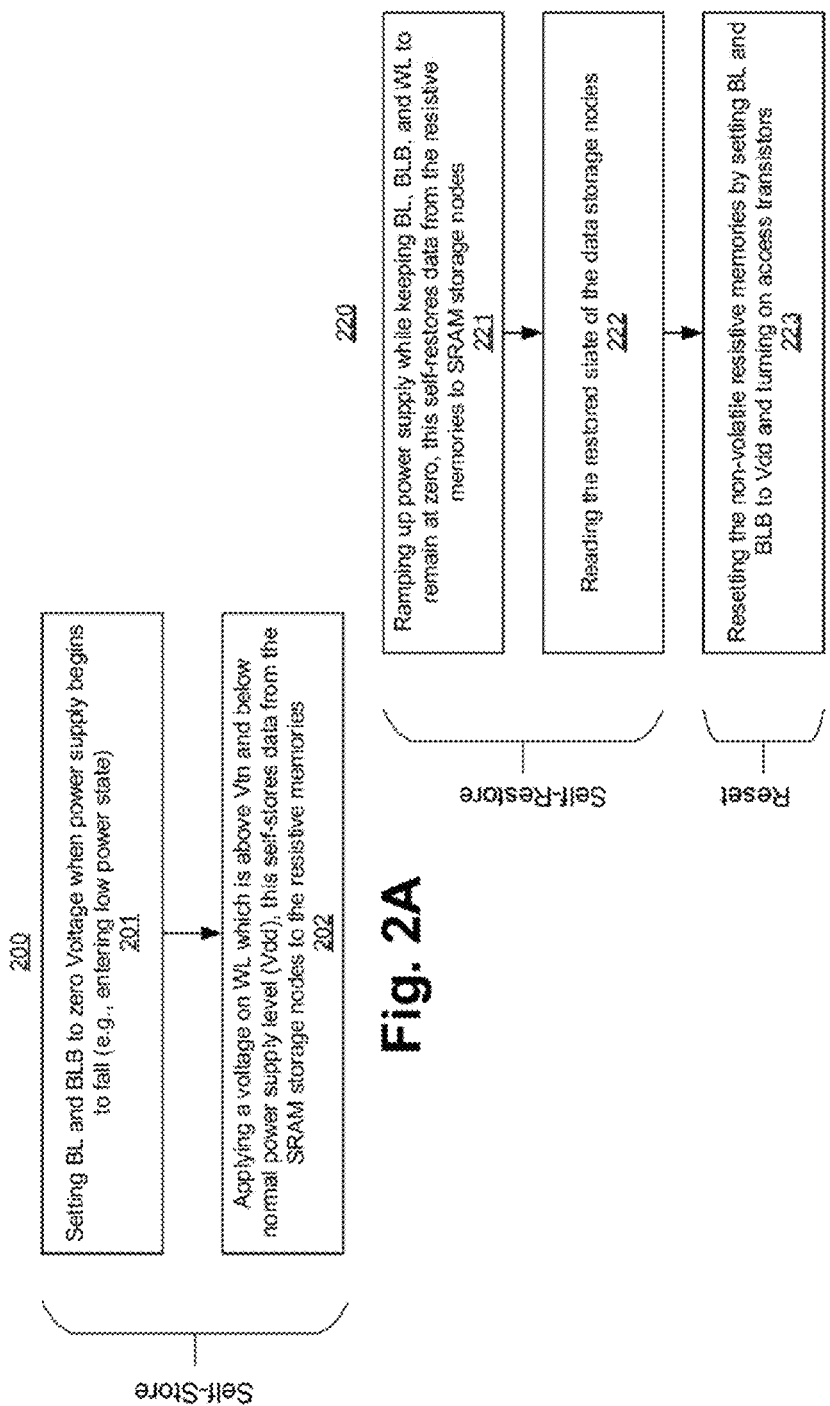
FIG. 2A illustrates a flowchart of a method for self-storing data from volatile memory nodes to the integrated NV mirror cell, according to some embodiments of the disclosure.
FIG. 2B illustrates a flowchart of a method for self-restoring data to the volatile memory nodes from the integrated NV mirror cell, according to some embodiments of the disclosure.

FIG. 2A illustrates flowchart 200 of a method for self-storing data from volatile memory nodes to the integrated NV mirror cell, according to some embodiments of the disclosure. It is pointed out that those elements of FIG. 2A having the same reference numbers (or names) as the elements of any other figure can operate or function in any manner similar to that described, but are not limited to such.

Although the blocks in flowchart 200 with reference to FIG. 2A are shown in a particular order, the order of the actions can be modified. Thus, the illustrated embodiments can be performed in a different order, and some actions/blocks may be performed in parallel. Some of the blocks and/or operations listed in FIG. 2A are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 201, First Logic 104 identifies that the SRAM is entering a low power state (e.g., sleep state) or is losing power (e.g., the SRAM is being turned off). In some embodiments, First Logic 104 initiates the self-store process by setting BL and BLB to zero volts. At block 202, First Logic 103 sets WL voltage such that it is above the threshold voltage of the access devices MN3 and MN4 but below the power supply Vcc. As such, resistances of first and/or second NV resistive elements 102 and 103 change according to the initial conditions of the storage nodes n1 and n2 (such that one of the NV resistive elements has resistance $R_L$ and the other has resistance $R_H$). Blocks 201 and 202 can be performed in parallel or in reverse order, according to some embodiments FIG. 2B illustrates flowchart 220 of a method for self-restoring data to the volatile memory nodes from the integrated NV mirror cell, according to some embodiments of the disclosure. It is pointed out that those elements of FIG. 2B having the same reference numbers (or names) as the elements of any other figure can operate or function in any manner similar to that described, but are not limited to such.

Although the blocks in flowchart 220 with reference to FIG. 2B are shown in a particular order, the order of the actions can be modified. Thus, the illustrated embodiments can be performed in a different order, and some actions/blocks may be performed in parallel. Some of the blocks and/or operations listed in FIG. 2B are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 221, Second Logic 105 causes BL, BLB, and WL to remain at zero volts as the power supply ramps from 0V to Vcc. Continuing with the example where node n1 was initially at Vcc level and node n2 was at zero volts, when the power supply is out (e.g., during low power state or when the computing system having the SRAM is powered off), voltages on BL, BLB, WL, and the internal nodes (e.g., n1, n2, n22, and n11) are discharged overtime to zero volts, according to some embodiments. Before the power supply reduces to 0V, voltage states on nodes n1 and n2 are imprinted on first and second NV resistive elements 102 and 103 as discussed with reference to FIG. 2A.

Referring back to FIG. 2B, as the power supply rises (i.e., Vcc rises to its normal level), the first inverter becomes operational and inverts the input n2 (at zero volts) to high voltage on node n11. Because of the low resistance $R_L$ of first NV resistive device 102, the voltage on node n1 rises from zero volts to Vcc. However, because of the high resistance $R_H$ of second NV resistive device 103, node n2 remains at zero volts as reinforced by the second inverter (i.e., transistors MP2 and MN2). As such, original data on the storage nodes n1 and n2 (i.e., logic high and logic low) are restored automatically as power supply rises to Vcc level.

At block 222, the restored values on nodes n1 and n2 can be read out by normal SRAM read operation. In some embodiments, read operation is performed after resetting first and second NV resistive elements 102 and 103. As such, at block 223, after the self-restore operation is complete (e.g., after waiting for a predetermined amount of time), first and second NV resistive elements 102 and 103 are reset. By resetting first and second NV resistive elements 102/103, issues related with historical data stored in first and second NV resistive elements 102/103 interfering with correctly storing of new data is avoided.

In some embodiments, Third Logic 105 is operable to reset first and second NV resistive elements 102 and 103 during idle time. For example, when no data is being recorded in the SRAM, or when the SRAM is inactive, Third Logic 105 initiates the reset operation. In some embodiments, to reset first and second NV resistive elements 102 and 103, both bit-lines (i.e., BL and BLB) and WL are set to the power supply level (i.e., Vcc). As such, the access devices MN3 and MN4 are turned on.

When the access device MN3 turns on, voltage on node n1 becomes logic high (i.e., Vcc level). Continuing with this example, the second inverter causes node n22 to become logic low (or to remain at logic low). Due to the previous high resistance state of second NV resistive device 103, voltage on node n2 remains the same (i.e., zero volts). By resetting the resistances of first and second NV resistive elements 102 and 103 to $R_H$, NV-SRAM bit-cell 101-1 can perform normal read operation because first and second NV resistive elements 102 and 103 do not interfere with its operation (i.e., block 222 can be performed after block 223).

Figure 3:
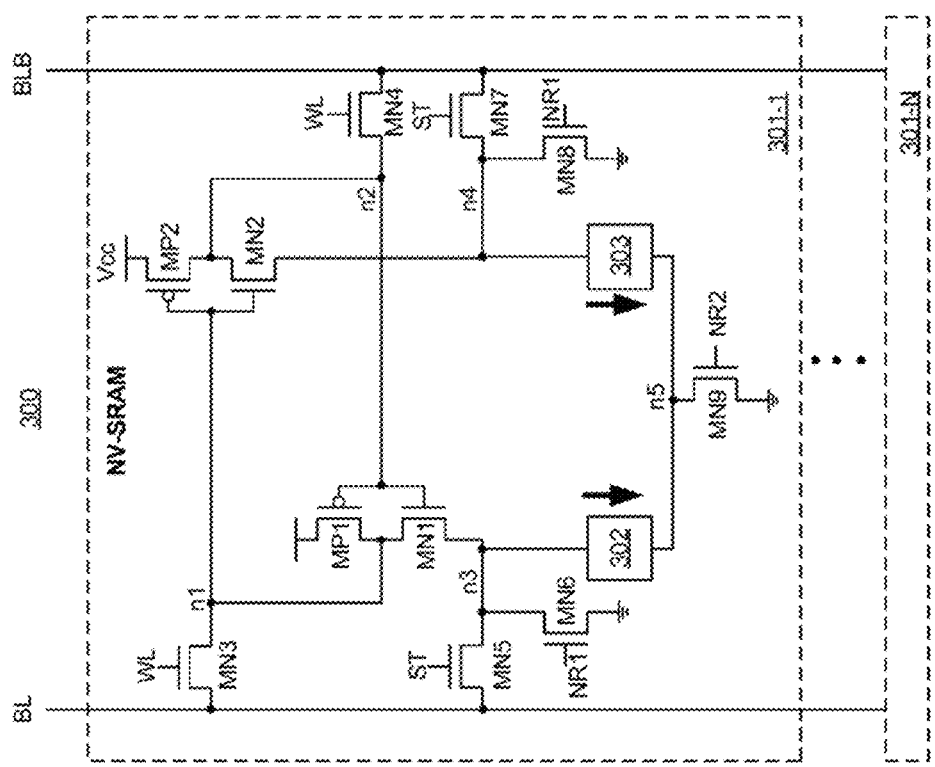
FIG. 3 illustrates an SRAM bit-cell including integrated NV mirror cell and associated logic, according to some embodiments of the disclosure.

FIG. 3 illustrates a column 300 of SRAM bit-cells including integrated NV mirror cells and associated logic, according to some embodiments of the disclosure. It is pointed out that those elements of FIG. 3 having the same reference numbers (or names) as the elements of any other figure can operate or function in any manner similar to that described, but are not limited to such.

Column 300 includes NV-SRAM 301-1 to 301-N, where 'N' is an integer. So as not to obscure the embodiments, differences between NV-SRAM 101-1 and NV-SRAM 301-1 are described. Here, first and second NV resistive elements 102 and 103 are removed. Instead of coupling the source terminals of transistors MN1 and MN2 to ground (or Vss), the source terminals of transistors MN1 and MN2 are coupled in series to first and second NV resistive elements 302 and 303, respectively. In some embodiments, NV-SRAM 301-1 comprises additional n-type devices MN5, MN6, MN7, MN8, and MN9.

In some embodiments, the source/drain terminal of transistor MN5 is coupled to node n3, the drain/source terminal of transistor MN5 is coupled to BL, and the gate terminal of transistor MN5 is coupled to ST. In some embodiments, the source/drain terminal of transistor MN7 is coupled to node n4, the drain/source terminal of transistor MN7 is coupled to BLB, and the gate terminal of transistor MN7 is coupled to ST. In some embodiments, the drain terminal of transistor MN6 is coupled to node n3, the source terminal of transistor MN6 is coupled to ground, and the gate terminal of transistor MN6 is coupled to NR1. In some embodiments, the drain terminal of transistor MN8 is coupled to node n4, the source terminal of transistor MN8 is coupled to ground, and the gate terminal of transistor MN8 is coupled to NR1. In some embodiments, first NV resistive device 302 is coupled to node n3 and the drain terminal of transistor MN9. In some embodiments, second NV resistive device 303 is coupled to node n4 and the drain terminal of transistor MN9. In some embodiments, the gate terminal of transistor MN9 is coupled to NR2.

While the embodiment of FIG. 3 is described with reference to additional five n-type devices MN5, MN7, MN6, MN8, and MN9, p-type transistors may be used instead as described with reference to FIG. 7.

Referring back to FIG. 3, in some embodiments, first and second NV resistive elements 302 and 303 store information using a memory element with a variable resistance. For example, the resistance of STT based device depends on the relative magnetization polarities of two magnetic layers (i.e., free magnetic layer and fixed/pinned magnetic layer). In some embodiments, first and second NV resistive memory elements 302 and 303 are MTJ devices. In one such embodiment, the free magnetic layer of MTJ device 302 is coupled to node n3 while the fixed magnetic layer of MTJ device 302 is coupled to the drain terminal of transistor MN9 (i.e., node n5). Continuing with the MTJ example, in some embodiments, the free magnetic layer of MTJ device 303 is coupled to node n4 and the fixed magnetic layer of MTJ device 303 is coupled to the drain terminal of transistor MN9 (i.e., node n5).

In some embodiments, first and second NV resistive memory elements 302 and 303 are formed from conductive bridging devices as used in CBRAM. In some embodiments, first and second NV resistive memory elements 302 and 303 are formed with PCM devices. In some embodiments, first and second NV resistive memory elements 302 and 303 are formed using MIM based structures. In some embodiments, control signals NR1, NR2, and ST are provided by logic integrated within the NV-SRAM to self-store and self-restore the storage data to and from first and second NV resistive elements 302 and 303. In some embodiments, control signals NR1, NR2, and ST are provided by logic outside the NV-SRAM to self-store and self-restore the storage data to and from first and second NV resistive elements 302 and 303. In some embodiments, NV resistive elements 302/303 are directional as indicated by the downward facing bold arrows next to the NV resistive elements 302/303.

Figure 4A:
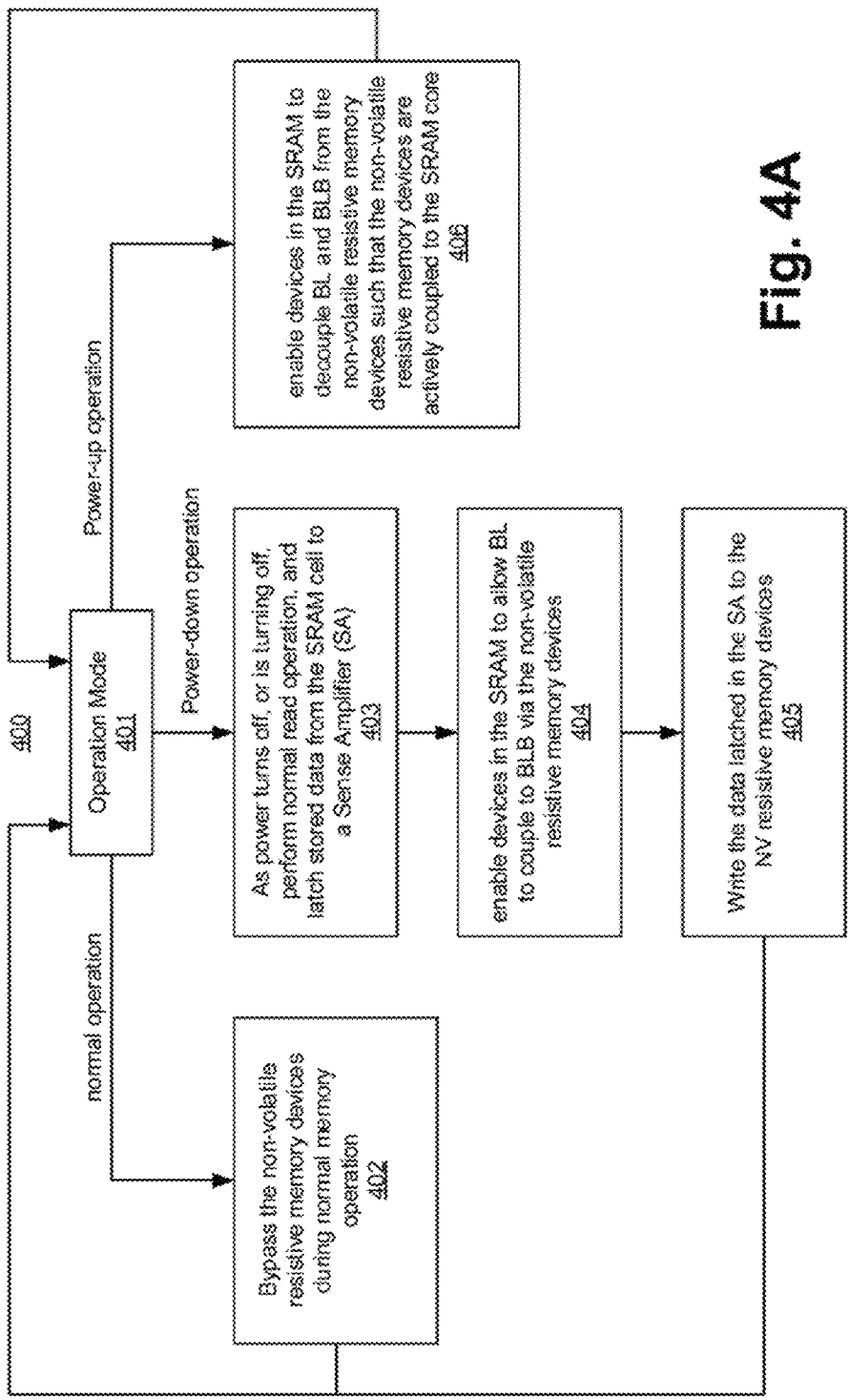
FIG. 4A illustrates a flowchart of a method for self-storing and self-restoring data for the SRAM bit-cell of FIG. 3, according to some embodiments of the disclosure.

FIG. 4A illustrates flowchart 400 of a method for self-storing and self-restoring data for the SRAM bit-cell of FIG. 3, according to some embodiments of the disclosure. It is pointed out that those elements of FIG. 4A having the same reference numbers (or names) as the elements of any other figure can operate or function in any manner similar to that described, but are not limited to such.

Although the blocks in the flowchart with reference to FIG. 4A are shown in a particular order, the order of the actions can be modified. Thus, the illustrated embodiments can be performed in a different order, and some actions/blocks may be performed in parallel. Some of the blocks and/or operations listed in FIG. 4A are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 401, operation mode of the NV-SRAM is determined. For example, if the operational mode is normal operation mode then, at block 402, first and second NV resistive memory elements 302 and 303 are electrically bypassed and nodes n3 and n4 are grounded. Normal operational mode is a mode where the SRAM reads and writes as if there are no NV resistive memory elements integrated in the SRAM. During normal operation, logic unit (not shown) causes control signals NR1 and NR2 to become logic high (i.e., Vcc). As such, transistors MN6, MN8, and MN9 are turned on and nodes n3, n4, and n5 are pulled to ground. During normal mode, the logic unit sets ST signal to logic low to turn off transistors MN5 and MN7. By causing the nodes n3, n4, and n5 to be pulled to ground, first and second NV resistive memory elements 302 and 303 are bypassed, and the source terminals of transistors MN1 and MN2 are grounded which cause the NV-SRAM bit-cell 301-1 to electrically function as a 6T SRAM bit-cell. Grounding the nodes n3, n4, and n5 cuts off DC leakage path through first and second NV resistive memory elements 302 and 303, respectively.

During power off (e.g., when NV-SRAM enters sleep state) or when power is turning off, the process proceeds to block 403. This is the power-down operation mode. At block 403, a normal read operation is performed on the NV-SRAM bit-cells. During normal read operation, data from NV-SRAM storage nodes (e.g., nodes n1 and n2) are stored in a Sense Amplifier (SA). In some embodiments, the data read out from the NV-SRAM bit-cells is not transferred out of the SRAM die or unit. As such, bus coupling the SRAM die to a processor or other dies is not transferring data.

At block 404, transistors MN5 and MN7 are enabled by setting the control signals ST to logic high (i.e., Vcc or voltage high enough to keep devices MN5 and MN7 turned on). In some embodiments, transistors MN6, MN8, and MN9 are turned off by setting NR1 and NR2 to ground. As such, BL is coupled to first resistive memory device 302 via transistor MN5, and BLB is coupled to second NV resistive memory device 303 via transistor MN7.

At block 405, data latched by the SA is written back to the NV-SRAM bit-cell 301-1. Before, the write-back operation starts, transistors MN5 and MN7 are turned on. In one example, to write data back, BL is set to logic high while BLB is set to logic low. As such, a current path is formed from BL to BLB. The current path caused by turning on MN5 and MN7 forces current to flow in opposite direction through first and second NV resistive memory elements 302 and 303. In some embodiments, the current flow through first and second resistive memory elements 302 and 303 causes one of the resistive memory elements to have resistance $R_H$ while the other has resistance $R_L$. In another example, the current path can be reversed (i.e., BL is set to logic low while BLB is set to logic high) because the logic status on BL and BLB may depend on the data status.

The different resistances for first and second NV resistive memory elements 302 and 303 is according to the data stored on storage nodes n1 and n2 (which is the same data that is re-written during the self-store process). In some embodiments, the process of blocks 403, 404, and 405 are repeated for all columns and rows of the NV-SRAM. One technical effect of the self-storing process for the NV-SRAM in FIG. 4A is that an intermediate voltage for WL is not needed.

During power on operation mode (e.g., when NV-SRAM enters an active state from a sleep state) or when power is turning on, the process proceeds to block 406 to perform self-restore operation. During self-restore, devices in the NV-SRAM 301-1 are enabled to decouple BL and BLB from first and second NV resistive memory elements 302 and 303 such that first and second NV resistive memory elements 302 and 303 are coupled to the SRAM core. Here, the SRAM core comprises the traditional 6T transistors, MP1, MN1, MP2, MN2, MN3, and MN4, in accordance with some embodiments.

In some embodiments, during self-restore, control signals NR1, NR2, and ST are at logic low level (i.e., ground). As such, transistors MN5, MN6, MN7, MN8, and MN9 are turned off. In some embodiments, at source nodes n2 and n4, transistors MN1 and MN2 can see the resistance $R_H$ of first resistive NV memory 302 and resistance $R_L$ of second resistive NV memory 303, respectively. Since NR2 is set to logic low (i.e., transistor MP is turned off), node n5 charges to Vcc.

Figure 4B:
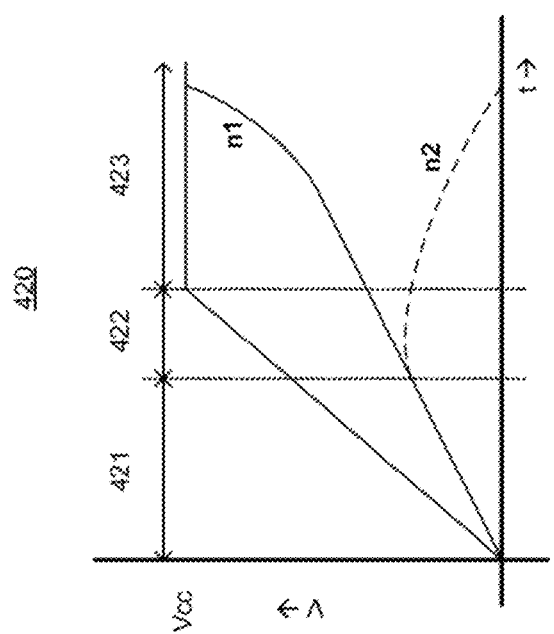
FIG. 4B illustrates a plot showing operation of the SRAM of FIG. 3, according to some embodiments of the disclosure.

FIG. 4B illustrates plot 420 showing self-restore operation of the SRAM of FIG. 3 during power-up, according to some embodiments of the disclosure. It is pointed out that those elements of FIG. 4B having the same reference numbers (or names) as the elements of any other figure can operate or function in any manner similar to that described, but are not limited to such. Here, x-axis is time and y-axis is supply (Vcc).

Plot 420 is divided into three regions—421, 422, and 423. Region 421 is the region when the power supply Vcc is ramping from 0V to its normal level. During this region, storage nodes n1 and n2 are pulled-up together through transistors MP1 and MP2, respectively. Region 422 is the region when transistor MN9 turns on first and then transistors MN1 and MN2 try to turn on. In some embodiments, due to high resistance $R_H$ of first NV resistive memory 302, the threshold voltage (Vt) of transistor MN1 becomes higher than the Vt of transistor MN2 (i.e., transistors MN1 and MN2 are source degenerated). As such, transistor MN1 turn-on duration is delayed compared to the turn-on duration of transistor MN2. The "turn-on" duration is the time it takes the device to fully turn on. During that time, due to the delay of transistor MN1 turning on, the voltage level at node n1 ramps up faster and higher than the voltage level on node n2. Region 423 is the region where the transistor MN2 automatically turns on stronger than transistor MN1. As such, the voltage on node n2 is pulled down to ground while the voltage on node n1 stays high.

Figure 5:
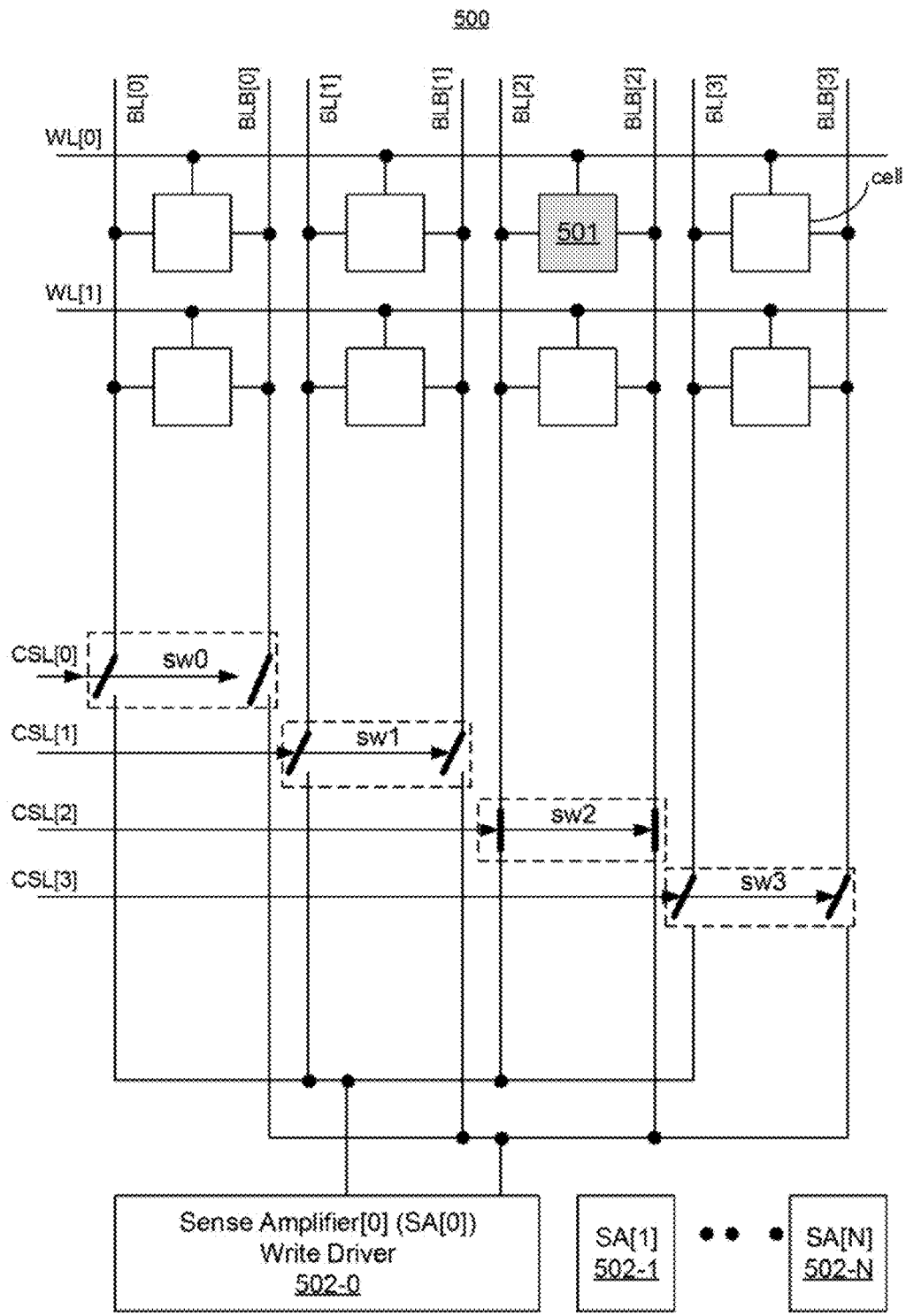
FIG. 5 illustrates a memory architecture for self-storing and self-restoring of data for the SRAM bit-cell of FIG. 3, according to some embodiments of the disclosure.

FIG. 5 illustrates memory architecture 500 for self-storing and self-restoring data for the SRAM bit-cell of FIG. 3, according to some embodiments of the disclosure. It is pointed out that those elements of FIG. 5 having the same reference numbers (or names) as the elements of any other figure can operate or function in any manner similar to that described, but are not limited to such.

In some embodiments, memory architecture 500 comprises columns of NV-SRAM bit-cells (e.g., bit-cell 501 (same as 301-1)), Column Select switches, and Sense Amplifiers 502-0 through 502-N, where 'N' is an integer. Each row of NV-SRAM bit-cells receives a dedicated WL (e.g., 128 WLs per block of memory). For example, the first row is controlled by WL[0], the next row is controlled by WL[1], and so on. Each column of NV-SRAM bit-cells receives BL and its complementary BLB. In this example, four BLs and BLBs are shown (i.e., BL[0] through BL[3], and BLB[0] through BLB[3]). The BL and BLB are coupled to the SA and the Write Driver by the Column Select switches (e.g., sw0, sw1, sw2, and sw3). In some embodiments, to self-store data to the NV resistive memory elements, SRAM data is read out using normal read operation. During normal read operation, Column Select switches are turned on to latch the read data to the SA (e.g., SA 502-1). This latched data is then written back by a Write Driver via BL and BLB to the NV resistive memory elements of the selected NV-SRAM (e.g., NV-SRAM bit-cell 501).

In some embodiments, a control logic (not shown) is implemented within the NV-SRAM die or section and is operable to perform the following functions during power-on, after power-on, and before power-off. In some embodiments, during power-on, generally a processor generates a power-on reset (POR) or power-good (PG) signal. In some embodiments, during power-on and before POR or PG signal, NR2 is forced to logic high (i.e., Vcc) while NR1 and ST signals are forced to logic low (i.e., ground). In some embodiments, after power-on (i.e., after POR or PG are generated), NR2 stays at logic high (i.e., Vcc). The Vcc after power-on is at its full normal level. In some embodiments, NR1 is forced to logic high (i.e., Vcc) by triggering of POR or PG.

In some embodiments, before power-off, NV-SRAM die or section receives power-off (PO) signal. For example, NV-SRAM receives PO signal from a System-on-Chip (SoC). In some embodiments, after PO signal is received, NV-SRAM die to section gets ready for the self-store operation by following one of the command sequences discussed with reference to FIGS. 6A-C. In some embodiments, these command sequences can eliminate the data bus transaction and also reduce the command bus transactions. As such, low power consumption is achieved compared to existing NV restore technologies that use external NV mirror arrays, devices, and chips.

Figure 6A:
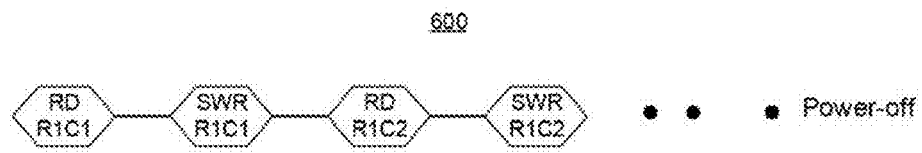
FIGS. 6A-C illustrate sequence of commands for self-storing using SRAM bit-cell of FIG. 3, according to some embodiments of the disclosure.
Figure 6B:
Figure 6C:
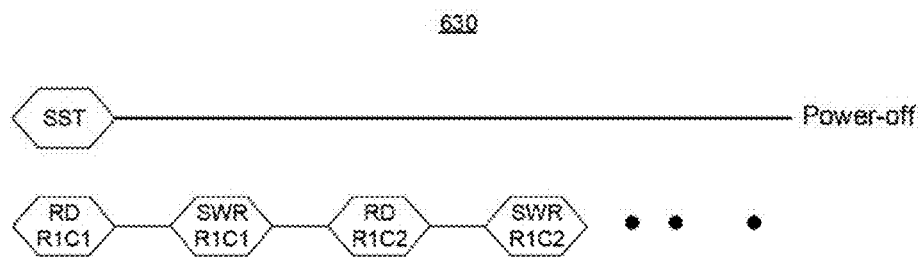

FIGS. 6A-C illustrate sequence of commands 600, 620, and 630 for self-storing using SRAM bit-cell of FIG. 3, according to some embodiments of the disclosure. It is pointed out that those elements of FIGS. 6A-C having the same reference numbers (or names) as the elements of any other figure can operate or function in any manner similar to that described, but are not limited to such.

Sequence of commands 600 uses Read (RD) and Store-Write (SWR) commands to perform self-storing operation. For each row and column, RD and SWR operations are performed. For example, RD is performed on the first row R1 and the first column C1 (i.e., R1C1) followed by SWR on R1C1, and so on till power turns off. In some embodiments, a memory controller (not shown) issues the RD and SWR commands to perform self-storing operation of NV-SRAM (such as those described with reference to FIG. 3). Sequence command 600 illustrates an example where memory controller commands are used more than internally generated commands for self-storing.

Sequence of commands 620 reduces the bus traffic compared to sequence of commands 600 by reducing commands issued by the memory controller. In some embodiments, a new command called Store is defined that combines Load-Read (LRD) and Store-Write commands. As such, the number of commands issued by memory controller to perform self-store operation is halved. In this example, STR command is issued for each row and column of the NV-SRAM to perform self-store operation till power turns off.

Sequence of commands 630 further reduces the bus traffic compared to sequence of commands 630. In some embodiments, a new command Self-Store (SST) is defined which is issued once by the memory controller for the NV-SRAM. Once issued, NV-SRAM internally (i.e., independent of the memory controller issued commands) performs RD and SWR operations per row and column of the NV-SRAM.

In some embodiments, SST controller logic with address counter is implemented in the NV-SRAM die or section. In some embodiments, like Dynamic Random Access Memory (DRAM) Self-Refresh mode, after memory controller issues SST, NV-SRAM die or section operates the STR operation with the address counter internally and automatically. The second command line in the sequence of commands 630 is the internal image of the command operations in the NV-SRAM die or section in accordance with some embodiments. In some embodiments, after receiving the SST command, the NV-SRAM die or section itself operates the command sequence (i.e., the second command line) with the sequentially and internally generated addresses.

Figure 7:
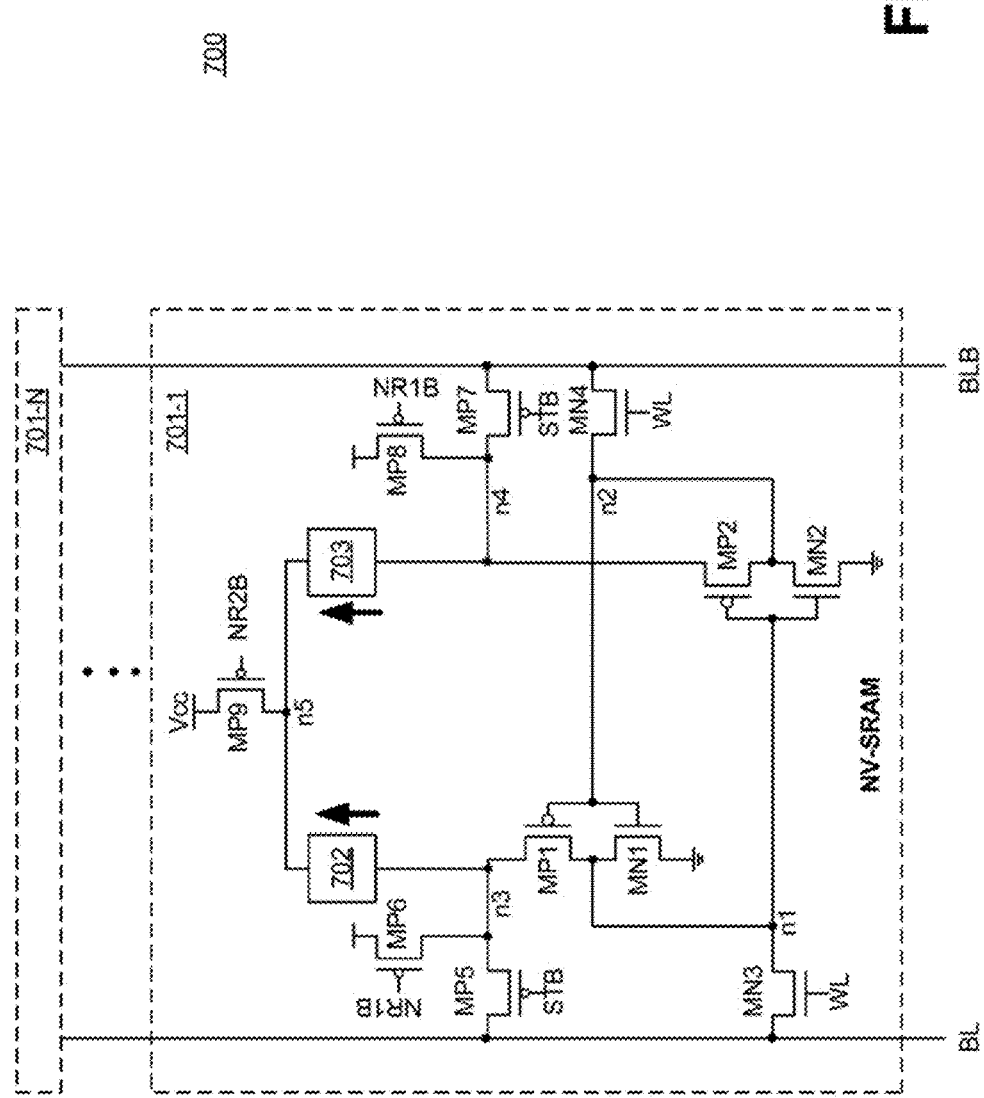
FIG. 7 illustrates an SRAM bit-cell including integrated NV mirror cell and associated logic, according to some embodiments of the disclosure.

FIG. 7 illustrates NV-SRAM bit-cell 700, according to some embodiments of the disclosure. It is pointed out that those elements of FIG. 7 having the same reference numbers (or names) as the elements of any other figure can operate or function in any manner similar to that described, but are not limited to such. While the embodiment of FIG. 3 is described with reference to additional five n-type devices MN5, MN7, MN6, MN8, and MN9, p-type transistors are used instead as described with reference to NV-SRAM bit-cell 700.

In some embodiments, the source/drain terminal of transistor MP5 is coupled to node n3, the drain/source terminal of transistor MP5 is coupled to BL, and the gate terminal of transistor MP5 is coupled to STB. Here, STB is inverse of ST, NR1B is inverse of NR1, and NR2B is inverse of NR2. In some embodiments, the source/drain terminal of transistor MP7 is coupled to node n4, the drain/source terminal of transistor MP7 is coupled to BLB, and the gate terminal of transistor MP7 is coupled to STB. In some embodiments, the drain terminal of transistor MP6 is coupled to node n3, the source terminal of transistor MP6 is coupled to supply (Vcc), and the gate terminal of transistor MP6 is coupled to NR1B. Here, node n3 is coupled to source/drain terminal of MP1 while node n4 is coupled to source/drain terminal of MP2.

In some embodiments, the drain terminal of transistor MP8 is coupled to node n4, the source terminal of transistor MP8 is coupled to the power supply (Vcc), and the gate terminal of transistor MP8 is coupled to NR1B. In some embodiments, first NV resistive device 702 is coupled to node n3 and the drain terminal of transistor MP9. In some embodiments, second NV resistive device 703 is coupled to node n4 and the drain terminal of transistor MP9. In some embodiments, the gate terminal of transistor MP9 is coupled to NR2B. The source terminal of MP9 is coupled to power supply Vcc.

In some embodiments, first and second NV resistive elements 702 and 703 store information using a memory element with a variable resistance. For example, the resistance of STT based device depends on the relative magnetization polarities of two magnetic layers (i.e., free magnetic layer and fixed/pinned magnetic layer). In some embodiments, first and second NV resistive memory elements 702 and 703 are MTJ devices. In one such embodiment, the free magnetic layer of MTJ device 702 is coupled to node n3 while the fixed magnetic layer of MTJ device 702 is coupled to the drain terminal of transistor MP9 (i.e., node n5). Continuing with the MTJ example, in some embodiments, the free magnetic layer of MTJ device 703 is coupled to node n4 and the fixed magnetic layer of MTJ device 703 is coupled to the drain terminal of transistor MP9 (i.e., node n5).

In some embodiments, first and second NV resistive memory elements 702 and 703 are formed from conductive bridging devices as used in CBRAM. In some embodiments, first and second NV resistive memory elements 702 and 703 are formed with PCM devices. In some embodiments, first and second NV resistive memory elements 702 and 703 are formed using MIM based structures. In some embodiments, control signals NR1B, NR2B, and STB are provided by logic integrated within the NV-SRAM to self-store and self-restore the storage data to and from first and second NV resistive elements 702 and 703. In some embodiments, control signals NR1B, NR2B, and STB are provided by logic outside the NV-SRAM to self-store and self-restore the storage data to and from first and second NV resistive elements 702 and 703. In some embodiments, NV resistive elements 702/703 are directional as indicated by the upward facing bold arrows next to the NV resistive elements 302/303.

The operations of self-store and self-restore are similar to those described with reference to FIG. 3. In some embodiments, an additional inversion logic is added to write back data to the NV resistive elements 702 and 703, respectively.

Figure 8:
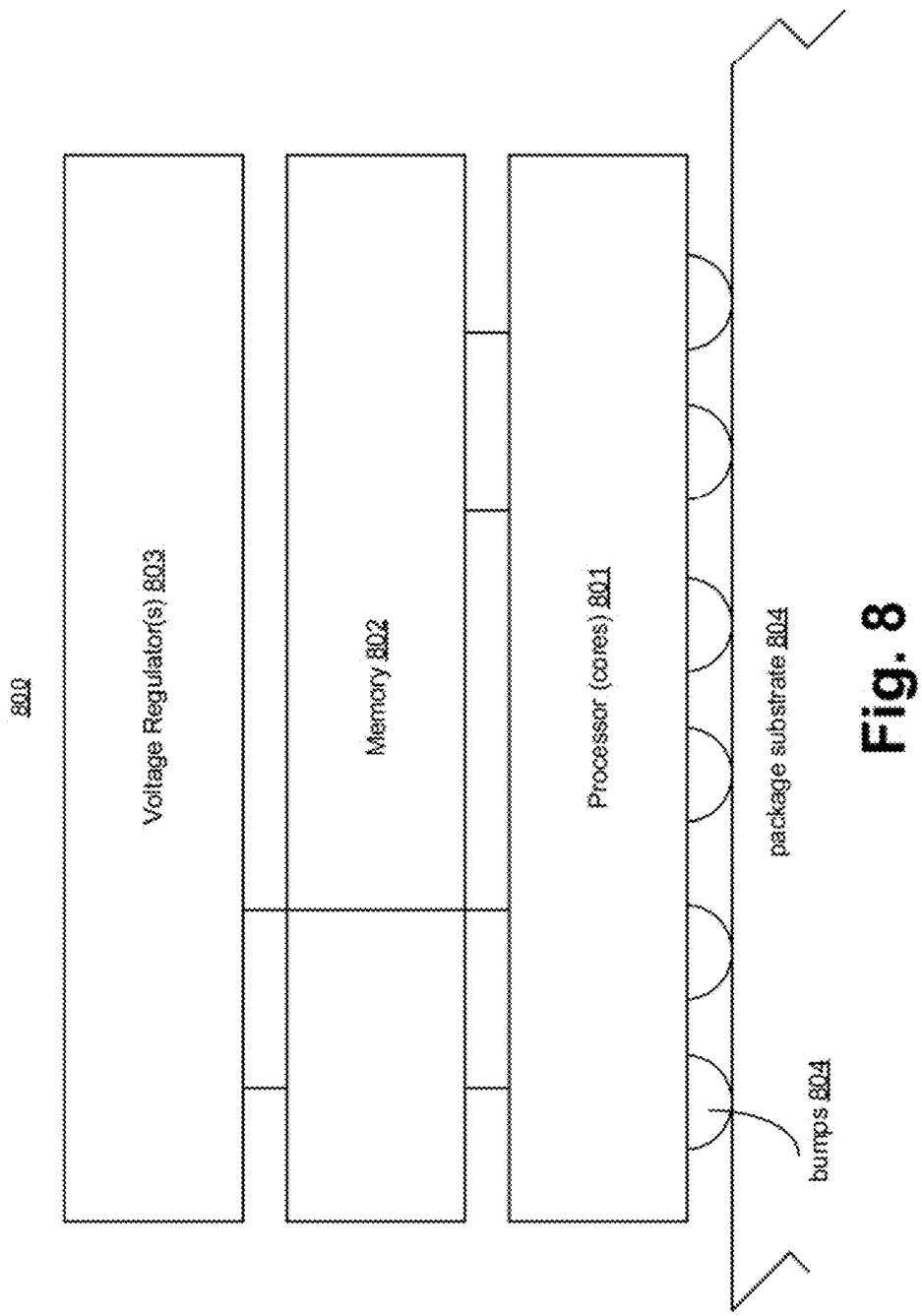
FIG. 8 illustrates a three-dimensional (3D) Integrated Circuit (IC) with SRAM having integrated NV-memory, according to some embodiments of the disclosure.

FIG. 8 illustrates a three-dimensional (3D) Integrated Circuit (IC) 800 with SRAM having integrated NV-memory, according to some embodiments of the disclosure. It is pointed out that those elements of FIG. 8 having the same reference numbers (or names) as the elements of any other figure can operate or function in any manner similar to that described, but are not limited to such.

In some embodiments, 3D IC 800 comprises Processor die 801 having one or more processor cores, Memory die 802 (e.g., memory architecture 800 with NV-SRAM as described with reference to various embodiments), Voltage Regulator(s) die 803, bumps 804 for coupling the Processor die 801 to package substrate 804. In some embodiments, Processor die 801 may include the memory controller for controlling Memory due 802. 3D IC 800 may have more or fewer dies shown packaged together in a single package. For example, a communications die having an integrated antenna may also be coupled to one of the dies in 3D IC 800.

The order of the dies may be different for different embodiments. For example, Voltage Regulator(s) 803 may be sandwiched between Memory die 802 and Processor die 801.

Figure 9:
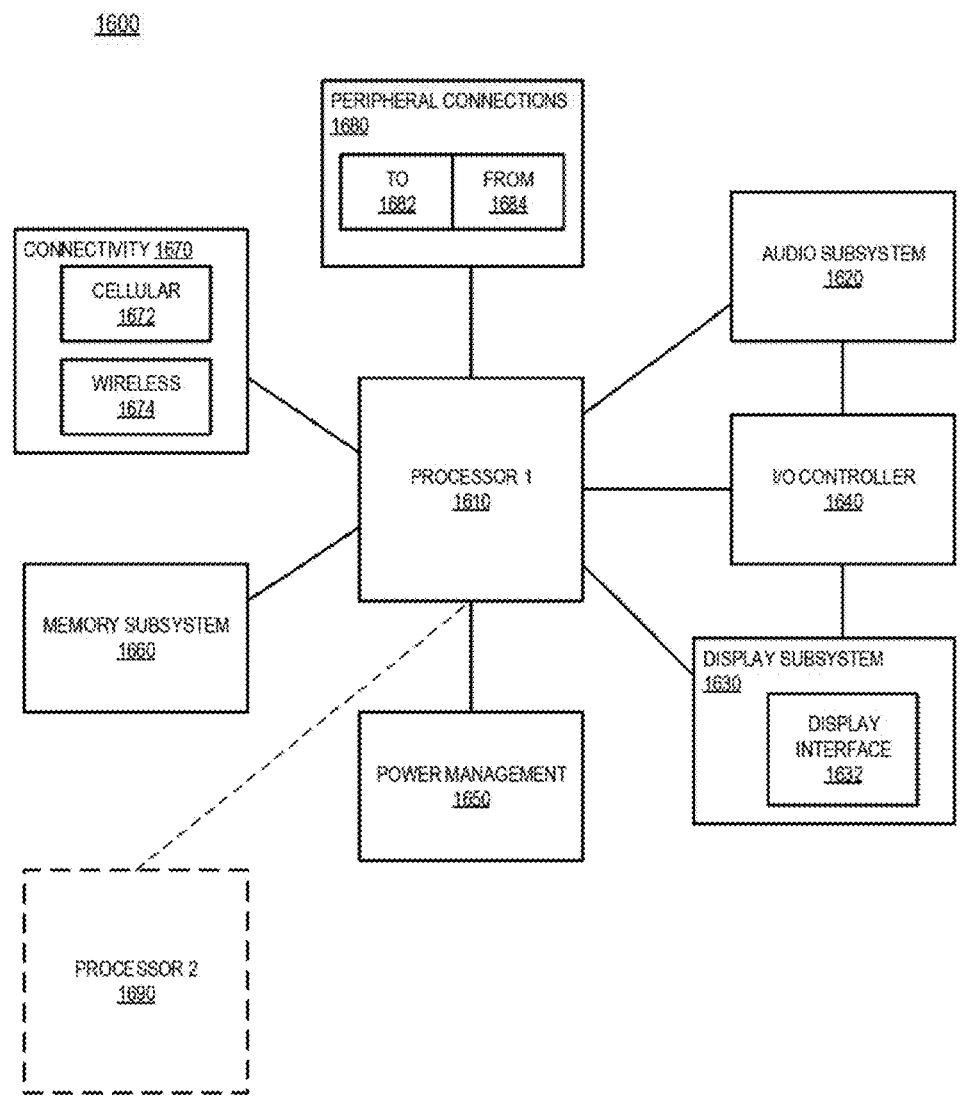
FIG. 9 illustrates a smart device or a computer system or a SoC (System-on-Chip) with SRAM having integrated NV-memory, according to some embodiments.

FIG. 9 illustrates a smart device or a computer system or a SoC (System-on-Chip) with SRAM having integrated NV-memory, according to some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with SRAM having integrated NV-memory, according to some embodiments discussed. Other blocks of the computing device 1600 may also include SRAM having integrated NV-memory, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. In some embodiments, Memory subsystem 1660 comprises SRAM having integrated NV-memory. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a SRAM cell with at least two NV resistive memory elements integrated within the SRAM cell; and first logic to self-store data stored in the SRAM cell to the at least two NV resistive memory elements. In some embodiments, the first logic is operable to self-store the data when the voltage applied to the SRAM cell decreases to a threshold voltage or gets close to the threshold voltage. In some embodiments, the first logic is operable to self-store the data by discharging voltages on a bit-line and a complementary bit-line to ground.

In some embodiments, the apparatus comprises second logic to self-restore data from the at least two NV resistive memory elements back to the SRAM cell. In some embodiments, the second logic is operable to self-restore data from the at least two NV resistive memory elements when the voltage applied to the SRAM cell increases to a threshold voltage. In some embodiments, the second logic is operable to self-restore data from the at least two NV resistive memory elements when the voltage applied to the SRAM cell is close to a power supply level.

In some embodiments, the second logic is operable to apply ground voltages to the bit-line, complementary bit-line, and a word-line during power-up. In some embodiments, the apparatus comprises third logic which is operable to reset the at least two NV resistive memory elements. In some embodiments, the third logic is operable to reset the at least two NV resistive memory elements by setting bit-line and complementary bit-line to logic high. In some embodiments, the at least two NV resistive elements are coupled in series.

In some embodiments, the apparatus comprises a source transistor coupled to a common node of the at least two NV resistive elements. In some embodiments, the apparatus comprises: a first transistor coupled to one of the at least two NV resistive elements and a first access device; and a second transistor coupled to another of the at least two NV resistive elements and a second access device.

In some embodiments, the apparatus comprises: a third transistor coupled to a common node of the first transistor and the one of the at least two NV resistive elements; and a fourth transistor coupled to a common node of the second transistor and the other of the at least two NV resistive elements. In some embodiments, the first and third transistors are controllable by a first control signal. In some embodiments, the second and fourth transistors are controllable by a second control signal. In some embodiments, the apparatus logic to bypass the at least two NV resistive elements during normal memory operation. In some embodiments, the logic causes current to flow from bit-line and complementary bit-line through the at least two NV resistive elements and the source transistor. In some embodiments, the NV resistive memory elements are integrated with the SRAM cell such that states of the NV resistive memory elements are preserved during normal operations of the SRAM cell.

In another example, a system is provide which comprises: a processor; a memory coupled to the processor, the memory including apparatus according to the apparatus described above; and a wireless interface for allowing the processor to communicate with another device.

In another example, a method is provided which comprises: performing a self-storing operation, when a voltage applied to a SRAM cell decreases to a threshold voltage, to store voltage states of the SRAM cell to at least two non-volatile (NV) resistive memory elements, wherein the at least two NV resistive memory elements are integrated with the SRAM cell; and performing self-restoring operation, when the voltage applied to the SRAM cell increases to the threshold voltage, by copying data from the at least two NV resistive memory elements to storage nodes of the SRAM cell.

In some embodiments, performing the self-storing operation comprises setting bit-line and complementary bit-line associated with the SRAM cell to ground. In some embodiments, performing reset operation on the at least two NV resistive memory elements. In some embodiments, performing the reset operation comprises setting bit-line and complementary bit-line to logic high. In some embodiments, the NV resistive memory elements are integrated with the SRAM cell such that states of the NV resistive memory elements are preserved during normal operations of the SRAM cell.

In another example, an apparatus is provided which comprises means for performing a self-storing operation, when a voltage applied to a SRAM cell decreases to a threshold voltage, to store voltage states of the SRAM cell to at least two NV resistive memory elements, wherein the at least two NV resistive memory elements are integrated with the SRAM cell; and means for performing self-restoring operation, when the voltage applied to the SRAM cell increases to the threshold voltage, by copying data from the at least two NV resistive memory elements to storage nodes of the SRAM cell.

In some embodiments, the means for performing the self-storing operation comprises means for setting bit-line and complementary bit-line associated with the SRAM cell to ground. In some embodiments, the apparatus comprises means for performing reset operation on the at least two NV resistive memory elements. In some embodiments, the means for performing the reset operation comprises means for setting bit-line and complementary bit-line to logic high. In some embodiments, the NV resistive memory elements are integrated with the SRAM cell such that states of the NV resistive memory elements are preserved during normal operations of the SRAM cell.

In another example, a system is provide which comprises: a processor; a memory coupled to the processor, the memory including apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a Static Random Access Memory (SRAM) cell with at least two non-volatile (NV) resistive memory elements integrated within the SRAM cell; and
   first logic to self-store data stored in the SRAM cell to the at least two NV resistive memory elements, wherein the first logic is to self-store the data by discharging voltages on both a bit-line and a complementary bit-line to ground.

2. The apparatus of claim 1, wherein the first logic is operable to self-store the data when the voltage applied to the SRAM cell decreases to a threshold voltage or gets close to the threshold voltage.

3. The apparatus of claim 1 comprises second logic to self-restore data from the at least two NV resistive memory elements back to the SRAM cell.

4. The apparatus of claim 1, wherein the second logic is operable to self-restore data from the at least two NV resistive memory elements when the voltage applied to the SRAM cell increases to a threshold voltage.

5. The apparatus of claim 1, wherein the second logic is operable to self-restore data from the at least two NV resistive memory elements when the voltage applied to the SRAM cell is close to a power supply level.

6. The apparatus of claim 1, wherein the second logic is operable to apply ground voltages to the bit-line, complementary bit-line, and a word-line during power-up.

7. The apparatus of claim 1 comprises third logic which is operable to reset the at least two NV resistive memory elements.

8. The apparatus of claim 7, wherein the third logic is operable to reset the at least two NV resistive memory elements by setting bit-line and complementary bit-line to logic high.

9. The apparatus of claim 1, wherein the at least two NV resistive elements are coupled in series.

10. The apparatus of claim 9, comprises a source transistor coupled to a common node of the at least two NV resistive elements.

11. The apparatus of claim 10 comprises logic to bypass the at least two NV resistive elements during normal memory operation.

12. The apparatus of claim 11, wherein the logic causes current to flow from bit-line and complementary bit-line through the at least two NV resistive elements and the source transistor.

13. The apparatus of claim 9 comprises:
a first transistor coupled to one of the at least two NV resistive elements and a first access device; and
a second transistor coupled to another of the at least two NV resistive elements and a second access device.

14. The apparatus of claim 13 comprises:
a third transistor coupled to a common node of the first transistor and the one of the at least two NV resistive elements; and
a fourth transistor coupled to a common node of the second transistor and the other of the at least two NV resistive elements.

15. The apparatus of claim 14, wherein the second and fourth transistors are controllable by a second control signal.

16. The apparatus of claim 13, wherein the first and third transistors are controllable by a first control signal.

17. The apparatus of claim 1, wherein the NV resistive memory elements are integrated with the SRAM cell such that states of the NV resistive memory elements are preserved during normal operations of the SRAM cell.

18. A system comprising:
a processor;
a memory coupled to the processor, the memory including:
 a Static Random Access Memory (SRAM) cell with at least two non-volatile (NV) resistive memory elements integrated within the SRAM cell; and
 first logic to self-store data stored in the SRAM cell to the at least two NV resistive memory elements, wherein the first logic is to self-store the data by discharging voltages on both a bit-line and a complementary bit-line to ground; and
a wireless interface for allowing the processor to communicate with another device.

19. The system of claim 18, wherein the first logic is operable to self-store the data when a memory having the SRAM cell is being powered down, and wherein the memory comprises second logic to self-restore data from the at least two NV resistive memory elements back to the SRAM cell.

20. A method comprising:
performing a self-storing operation, when a voltage applied to a Static Random Access Memory (SRAM) cell decreases to a threshold voltage, to store voltage states of the SRAM cell to at least two non-volatile (NV) resistive memory elements, wherein the at least two NV resistive memory elements are integrated with the SRAM cell; and
performing self-restoring operation, when the voltage applied to the SRAM cell increases to the threshold voltage, by copying data from the at least two NV resistive memory elements to storage nodes of the SRAM cell, wherein performing the self-storing operation comprises setting bit-line and complementary bit-line associated with the SRAM cell to ground.

21. The method of claim 20 comprises performing reset operation on the at least two NV resistive memory elements.

22. The method of claim 21, wherein performing the reset operation comprises setting bit-line and complementary bit-line to logic high.

23. The method of claim 20, wherein the NV resistive memory elements are integrated with the SRAM cell such that states of the NV resistive memory elements are preserved during normal operations of the SRAM cell.

* * * * *